(12) United States Patent
Iinuma

(10) Patent No.: US 11,315,234 B2
(45) Date of Patent: Apr. 26, 2022

(54) SEMICONDUCTOR MANUFACTURING INSPECTION SYSTEM

(71) Applicant: Mitsubishi Electric Corporation, Tokyo (JP)

(72) Inventor: Motoki Iinuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/882,266

(22) Filed: May 22, 2020

(65) Prior Publication Data
US 2021/0097670 A1 Apr. 1, 2021

(30) Foreign Application Priority Data
Sep. 30, 2019 (JP) .............................. JP2019-178253

(51) Int. Cl.
*G06T 7/00* (2017.01)
*G01N 21/95* (2006.01)

(52) U.S. Cl.
CPC ....... *G06T 7/0004* (2013.01); *G01N 21/9501* (2013.01); *G06T 2207/30148* (2013.01)

(58) Field of Classification Search
CPC ......... G01T 7/0004; G06T 2207/30148; G06T 2207/10152; G01N 21/9501; G01N 21/8806; G01N 21/952; G01N 2021/95638; G01B 11/0608
USPC ........................... 356/237.1–237.5, 614–623; 382/145–151; 348/126, 131, 92, 94; 250/559.34
See application file for complete search history.

(56) References Cited

U.S. PATENT DOCUMENTS

| | | | | |
|---|---|---|---|---|
| 5,138,180 A | * | 8/1992 | Yamanaka | H01L 24/78 250/559.07 |
| 5,347,362 A | * | 9/1994 | Sugawara | G01N 21/95684 356/625 |
| 5,459,794 A | * | 10/1995 | Ninomiya | G01B 11/022 348/126 |
| 5,519,496 A | * | 5/1996 | Borgert | G01N 21/8806 356/394 |
| 2019/0348384 A1 | * | 11/2019 | Okuzono | G06T 7/60 |

FOREIGN PATENT DOCUMENTS

JP 2018-084504 A 5/2018

* cited by examiner

*Primary Examiner* — Hoa Q Pham
(74) *Attorney, Agent, or Firm* — Studebaker & Brackett PC

(57) ABSTRACT

An object of the present invention is to accurately measure the heights of wire loops densely disposed in a power module. A semiconductor manufacturing inspection system includes: an single-color illumination unit including a plurality of LED chips to emit light beams to a plurality of wire loops connected to surfaces of semiconductor elements; a camera to capture images of the wire loops; and an image processor to recognize an imaging region of each of the wire loops from the images, based on a luminance value and to measure the height of each of the wire loops based on the imaging region of the wire loop in the images. The LED chips emit the light beams to the separate wire loops, and the light beams emitted from two of the LED chips to adjacent two of the wire loops differ in luminance.

5 Claims, 7 Drawing Sheets

F I G. 4
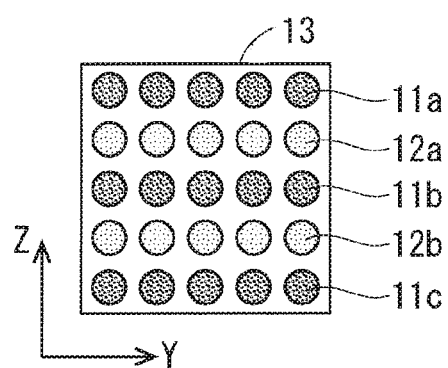

SEMICONDUCTOR MANUFACTURING INSPECTION SYSTEM

BACKGROUND OF THE INVENTION

Field of the Invention

This invention relates to, in a semiconductor power module, an inspection performed on a metal wire for electrically joining semiconductor elements, a semiconductor element to an insulating substrate, or lead frames.

Description of the Background Art

In a semiconductor power module (hereinafter simply referred to as a "power module"), a semiconductor element mounted on an insulating substrate or a lead frame is wired to an internal electrode or a lead frame through metal wires. Since the wiring density of metal wires is increased in response to the demand of, for example, downsizing the power modules or high power density, the wiring of the metal wires requires higher positional precision. Thus, the positions of the metal wires need to be accurately measured.

In this regard, for example, Japanese Patent Application Laid-Open No. 2018-084504 discloses the technology for acquiring two images of an electronic component placed higher than a reference plane (a focal plane) by alternately turning ON right and left LEDs of an illumination unit of an imaging apparatus mounted on a bonding apparatus and detecting the height of the electronic component relative to the reference plane using displacement between the two images.

According to this technology, the height of a plate-shaped object such as a semiconductor element is measured. When this technology is applied to measurement of the heights of wire loops, the following problems occur. Specifically, suppose a case where the height of each wire loop is measured from above the semiconductor element. When an interval between adjacent wire loops is, for example, approximately less than or equal to the width of one wire to be measured due to the increased density in the power modules, a wire loop adjacent to the wire loop to be measured is wrongly tracked, and a conforming item is misjudged as a defective item by determining that the wire loop is lying or deformed.

SUMMARY

An object of the present invention is to accurately measure the heights of wire loops densely disposed in a power module.

A semiconductor manufacturing inspection system according to the present invention includes an illumination unit, a camera, and an image processor. The illumination unit includes a plurality of LED chips to emit light beams to a plurality of wire loops connected to surfaces of semiconductor elements, the wire loops being made of a metal. The camera captures images of the wire loops above the wire loops, while moving in a direction parallel to the surfaces of the semiconductor elements. The image processor recognizes an imaging region of each of the wire loops from the images captured by the camera, based on a luminance value of a corresponding one of the images and to measure a height of each of the wire loops based on the imaging region of the wire loop in the images. The LED chips emit the light beams to the separate wire loops. The light beams emitted from two of the LED chips to adjacent two of the wire loops differ in luminance.

Since luminance values of reflected light beams are different between the adjacent wire loops in the semiconductor manufacturing inspection system according to the present invention, the image processor can prevent wrongly tracking another wire loop adjacent to the wire loop which is being tracked and to be measured. Thus, the heights of the wire loops densely disposed in a power module can be accurately measured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates an enlarged view of a single-color illumination unit on the Y-Z plane according to Embodiment 2;

DESCRIPTION OF THE PREFERRED EMBODIMENTS

A. Embodiment 1

[A-1 Structure]

Figure 1:
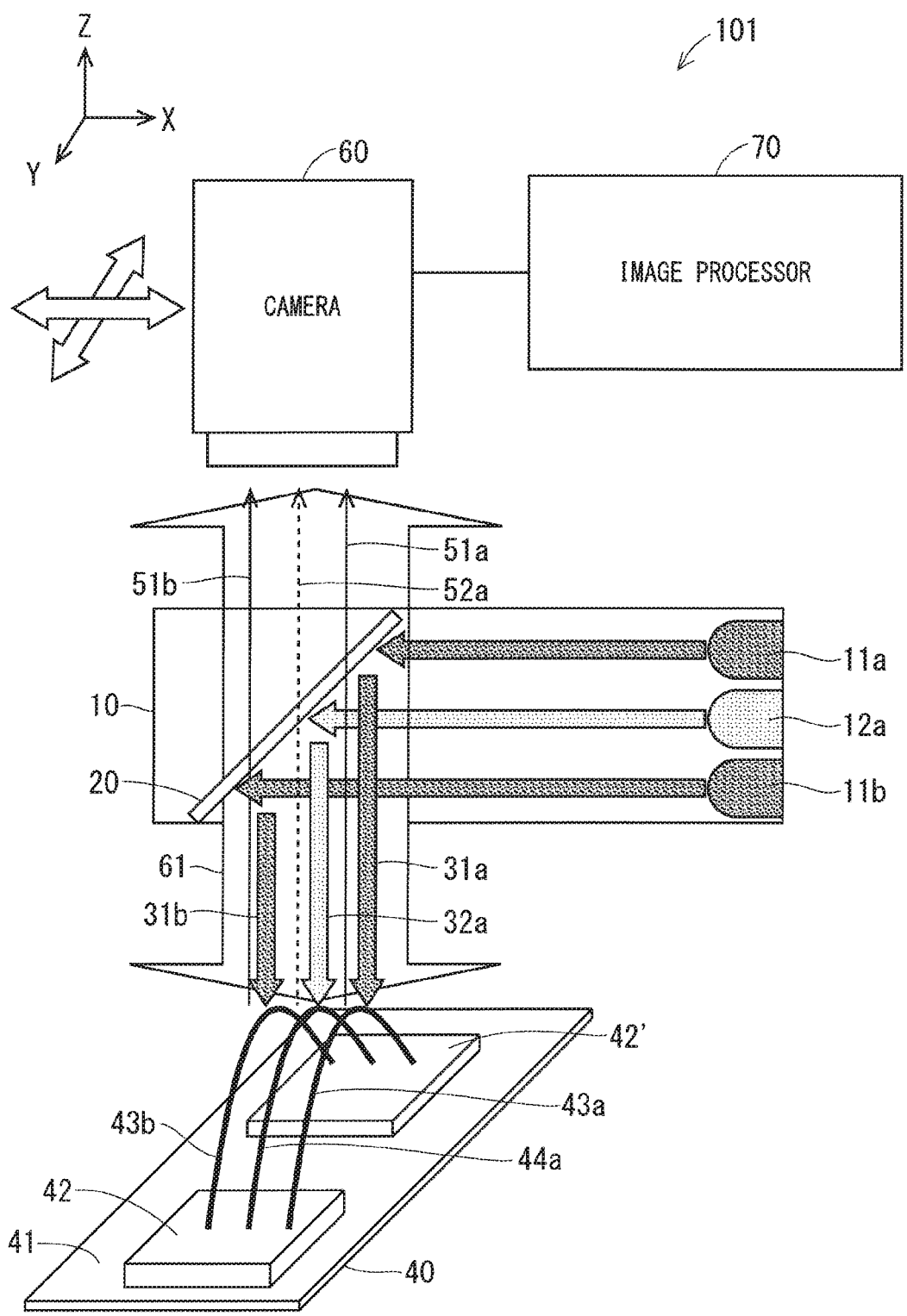
FIG. 1 illustrates a structure of a semiconductor manufacturing inspection system according to Embodiment 1.

FIG. 1 illustrates a structure of a semiconductor manufacturing inspection system 101 according to Embodiment 1. The semiconductor manufacturing inspection system 101 includes a single-color illumination unit 10, a measurement workpiece 40, a camera 60, and an image processor 70.

The measurement workpiece 40 is a semiconductor power module, and includes a lead frame 41, semiconductor elements 42 and 42' mounted on the lead frame 41, and three wire loops 43a, 43b, and 44a for connecting the semiconductor element 42 to the semiconductor element 42'. The wire loops 43a, 43b, and 44a are objects whose heights are to be measured by the semiconductor manufacturing inspection system 101. The direction of one side of the front surface of each of the semiconductor elements 42 and 42' to which the wire loops 43a, 43b, and 44a are connected is defined as an X-axis, the direction of the other side is defined as a Y-axis, and a direction perpendicular to the X-axis and the Y-axis is defined as a Z-axis. The wire loops 43a, 43b, and 44a are aligned in the negative X-axis direction. The wire loop 43a, the wire loop 44a, and the wire loop 43b will be hereinafter counted as the first loop, the second loop, and the third loop, respectively, in alignment order in the negative X-axis direction. The wire loops 43a, 43b, and 44a are made of, for example, a metal such as Al.

In FIG. 1, the wire loops 43a, 43b, and 44a connect the semiconductor element 42 to the semiconductor element 42'. Furthermore, the wire loops 43a, 43b, and 44a may connect the semiconductor element 42 or 42' to an external electrode connected outside the semiconductor power module. Furthermore, the semiconductor elements 42 and 42', which are mounted on the lead frame 41 in FIG. 1, may be mounted on an insulating substrate.

Figure 2:
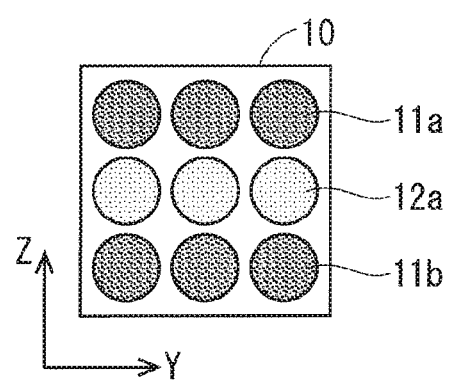
FIG. 2 illustrates an enlarged view of a single-color illumination unit on a Y-Z plane according to Embodiment 1.

The single-color illumination unit 10 includes LED chips 11$a$, 11$b$, and 12$a$, and a half mirror 20. FIG. 2 illustrates an enlarged view of the single-color illumination unit 10 on a Y-Z plane. As illustrated in FIG. 2, the three LED chips 11$a$ are aligned along the Y-axis direction. The same applies to the LED chips 11$b$ and 12$a$. Furthermore, the LED chips 11$a$, 12$a$, and 11$b$ are aligned in the negative Z-axis direction in this order. In other words, the single-color illumination unit 10 includes a 3×3 array of the LED chips on the Y-Z plane.

The luminance of the light beam emitted from the LED chips 12$a$ is set lower than those of the LED chips 11$a$ and 11$b$. In other words, the LED chips that emit a light beam of the first luminance and the LED chips that emit a light beam of the second luminance lower than the first luminance are alternately disposed in the Z-axis direction in the single-color illumination unit 10. The light beams emitted from the LED chips 11$a$, 11$b$, and 12$a$ are reflected by the half mirror 20 in a direction at right angles and enter the measurement workpiece 40 as incident light beams 31$a$, 31$b$, and 32$a$, respectively. The incident light beam 31$a$ is reflected by the wire loop 43$a$ and serves as a reflected light beam 51$a$. Similarly, the incident light beams 31$b$ and 32$a$ are reflected by the wire loops 43$b$ and 44$a$ and serve as reflected light beams 51$b$ and 52$a$, respectively. Thus, the alignment order of the LED chips 11$a$, 12$a$, and 11$b$ in the negative Z-axis direction corresponds to the alignment order of the wire loops 43$a$, 44$a$, and 43$b$ on the measurement workpiece 40 in the negative X-axis direction to which the LED chips 11$a$, 12$a$, and 11$b$ emit light beams, respectively. The optical axes of the light paths of the incident light beam 31$a$ and the reflected light beam 51$a$ coincide with each other. Similarly, the optical axes of the light paths of the incident light beam 31$b$ and the reflected light beam 51$b$ coincide with each other, and the optical axes of the light paths of the incident light beam 32$a$ and the reflected light beams 52$a$ coincide with each other.

The camera 60 is a camera that captures an image of the measurement workpiece 40, and obtains the reflected light beams 51$a$, 51$b$, and 52$a$ that are specular reflections from the measurement workpiece 40. The camera 60 consecutively captures the images during its movement in the X-Y plane direction, while maintaining a focal distance 61 in the Z-axis direction between the camera 60 and the wire loops 43$a$, 43$b$, and 44$a$.

The image processor 70 establishes a threshold range of luminances of a captured image for each of the wire loops, that is, a threshold range of luminances of a reflected light beam for the wire loop to recognize an imaging region of the wire loop from the image captured by the camera 60. The threshold range of the luminances for the first wire loop 43$a$ and the third wire loop 43$b$ is from T1 to T1' (hereinafter denoted by "T1-T1'"), and the threshold range of the luminances for the second wire loop 44$a$ is from T2 to T2' (hereinafter denoted by "T2-T2'"). Note that T2<T2'<T1<T1' is satisfied.

Although the image processor 70 recognizes the reflected light beam 51$a$ as the reflected light beam of the first wire loop 43$a$ when a luminance value L1$a$ of the reflected light beam 51$a$ satisfies T1≤L1$a$≤T1', it misrecognizes the reflected light beam 51$a$ as the reflected light beam of the second wire loop 44$a$ when the luminance value L1$a$ of the reflected light beam 51$a$ satisfies T2≤L1$a$<T2'. Similarly, although the image processor 70 recognizes the reflected light beam 51$b$ as the reflected light beam of the third wire loop 43$b$ when a luminance value L1$b$ of the reflected light beam 51$b$ satisfies T1<L1$b$<T1', it misrecognizes the reflected light beam 51$b$ as the reflected light beam of the second wire loop 44$a$ when the luminance value L1$b$ of the reflected light beam 51$b$ satisfies T2≤L1$b$≤T2'. Conversely, although the image processor 70 recognizes the reflected light beam 52$a$ as the reflected light beam of the second wire loop 44$a$ when a luminance value L2$a$ of the reflected light beam 52$a$ satisfies T2≤L2$a$≤T2', it misrecognizes the reflected light beam 52$a$ as the reflected light beam of the first wire loop 43$a$ or the third wire loop 43$b$ when the luminance value L2$a$ of the reflected light beam 52$a$ satisfies T1≤L2$a$≤T1'.

[A-2. Effects]

The effects of the semiconductor manufacturing inspection system 101 will be described with reference to FIGS. 1 and 2.

The luminances of the light beams emitted from the LED chips 11$a$ and 11$b$ are set higher than that of the LED chip 12$a$. Thus, the luminances of the incident light beams 31$a$ and 31$b$ are higher than that of the incident light beam 32$a$. The specular reflections above the wire loops 43$a$ and 43$b$ are stronger than that above the wire loop 44$a$. As a result, the luminance values L1$a$ and L1$b$ of the reflected light beams 51$a$ and 51$b$, respectively, are larger than the luminance value L2$a$ of the reflected light beam 52$a$.

The image processor 70 compares the luminance values L1$a$, L1$b$, and L2$a$ of the reflected light beams 51$a$, 51$b$, and 52$a$, respectively, with the thresholds established for the respective wire loops to recognize whether each of the reflected light beams 51$a$, 51$b$, and 52$a$ is the reflected light beam of one of the first to third wire loops. As described above, the threshold range T1-T1' for the first wire loop 43$a$ and the third wire loop 43$b$ is larger than the threshold range T2-T2' for the second wire loop 44$a$.

Thus, the luminance value L1$a$ of the reflected light beam 51$a$ of the first wire loop 43$a$ ranges between T1 and T1' but never decreases to the threshold range T2-T2' for the second wire loop 44$a$ adjacent to the first wire loop 43$a$. Furthermore, the luminance value L2$a$ of the reflected light beam 52$a$ of the second wire loop 44$a$ ranges between T2 and T2' but never increases to the threshold range T1-T1' for the first wire loop 43$a$ or the third wire loop 43$b$ that is adjacent to the second wire loop 44$a$.

As a result, the image processor 70 never misrecognizes the first wire loop 43$a$ as the second wire loop 44$a$ and vice versa, or never misrecognizes the second wire loop 44$a$ as the third wire loop 43$b$ and vice versa. Thus, when measuring the height of each of the wire loops, the semiconductor manufacturing inspection system 101 can prevent wrongly tracking another wire loop adjacent to the wire loop which is being tracked and to be measured, and accurately measure the heights of the wire loops densely disposed.

[A-3. Modification]

According to Embodiment 1, the same threshold range T1-T1' is established for the first wire loop 43$a$ and the third wire loop 43$b$ as a threshold range of luminances of a reflected light beam for recognizing the respective wire loops. However, different threshold ranges may be established for the first wire loop 43$a$ and the third wire loop 43$b$. For example, a threshold range T3-T3' of luminances of a light beam which is recognized as the reflected light beam of the third wire loop 43$b$ may be established. Thus, establishing the different threshold ranges for the respective wire loops 43$a$, 43$b$, and 44$a$ allows the image processor 70 to improve the precision of tracking the wire loops and accurately measure the heights of the wire loops densely disposed.

[A-4. Advantages]

The semiconductor manufacturing inspection system 101 according to Embodiment 1 includes: the single-color illumination unit 10 including the plurality of LED chips 11a, 11b, and 12a to emit light beams to the plurality of wire loops 43a, 43b, and 44a connected to surfaces of the semiconductor elements 42 and 42', the wire loops being made of a metal; the camera 60 to capture images of the wire loops 43a, 43b, and 44a above the wire loops 43a, 43b, and 44a, while moving in an X-Y plane direction parallel to the surfaces of the semiconductor elements 42 and 42'; and the image processor 70 to recognize an imaging region of each of the wire loops 43a, 43b, and 44a from the images captured by the camera 60, based on a luminance value of a corresponding one of the images and to measure a height of each of the wire loops 43a, 43b, and 44a based on the imaging region of the wire loop in the images. The LED chips 11a, 11b, and 12a emit the light beams to the separate wire loops 43a, 43b, and 44a, and the light beams emitted from two of the LED chips to adjacent two of the wire loops differ in luminance. Since the image processor 70 in the semiconductor manufacturing inspection system 101 with the aforementioned structure prevents wrongly tracking another wire loop adjacent to the wire loop which is being tracked and to be measured, it can accurately measure the heights of the wire loops 43a, 43b, and 44a densely disposed.

In the semiconductor manufacturing inspection system 101, the wire loops 43a, 44a, and 43b are aligned in one direction, the LED chips 11a, 12a, and 11b are aligned in an order identical to an order of the wire loops 43a, 44a, and 43b to which the LED chips 11a, 12a, and 11b emit the light beams, and among the LED chips, an LED chip that emits a light beam of a first luminance and an LED chip that emits a light beam of a second luminance lower than the first luminance are alternately disposed. Such a structure creates a difference in luminance between the reflected light beams of the adjacent wire loops. As a result, the image processor 70 prevents wrongly tracking another wire loop adjacent to the wire loop which is being tracked and to be measured.

In the semiconductor manufacturing inspection system 101, the image processor 70 establishes the threshold ranges T1-T1' and T2-T2' of the luminance values of the captured images to recognize the imaging regions of the wire loops 43a, 44a, and 43b, where the threshold ranges T1-T1' and T2-T2' do not overlap between the adjacent two wire loops. Since the image processor 70 in the semiconductor manufacturing inspection system 101 with the aforementioned structure prevents wrongly tracking another wire loop adjacent to the wire loop which is being tracked and to be measured, it can accurately measure the heights of the wire loops 43a, 43b, and 44a densely disposed.

B. Embodiment 2

In Embodiment 2, the same reference numerals will be assigned to the same structure as that according to Embodiment 1 described above, and the description thereof will be omitted as necessary.

[B-1. Structure]

Figure 3:
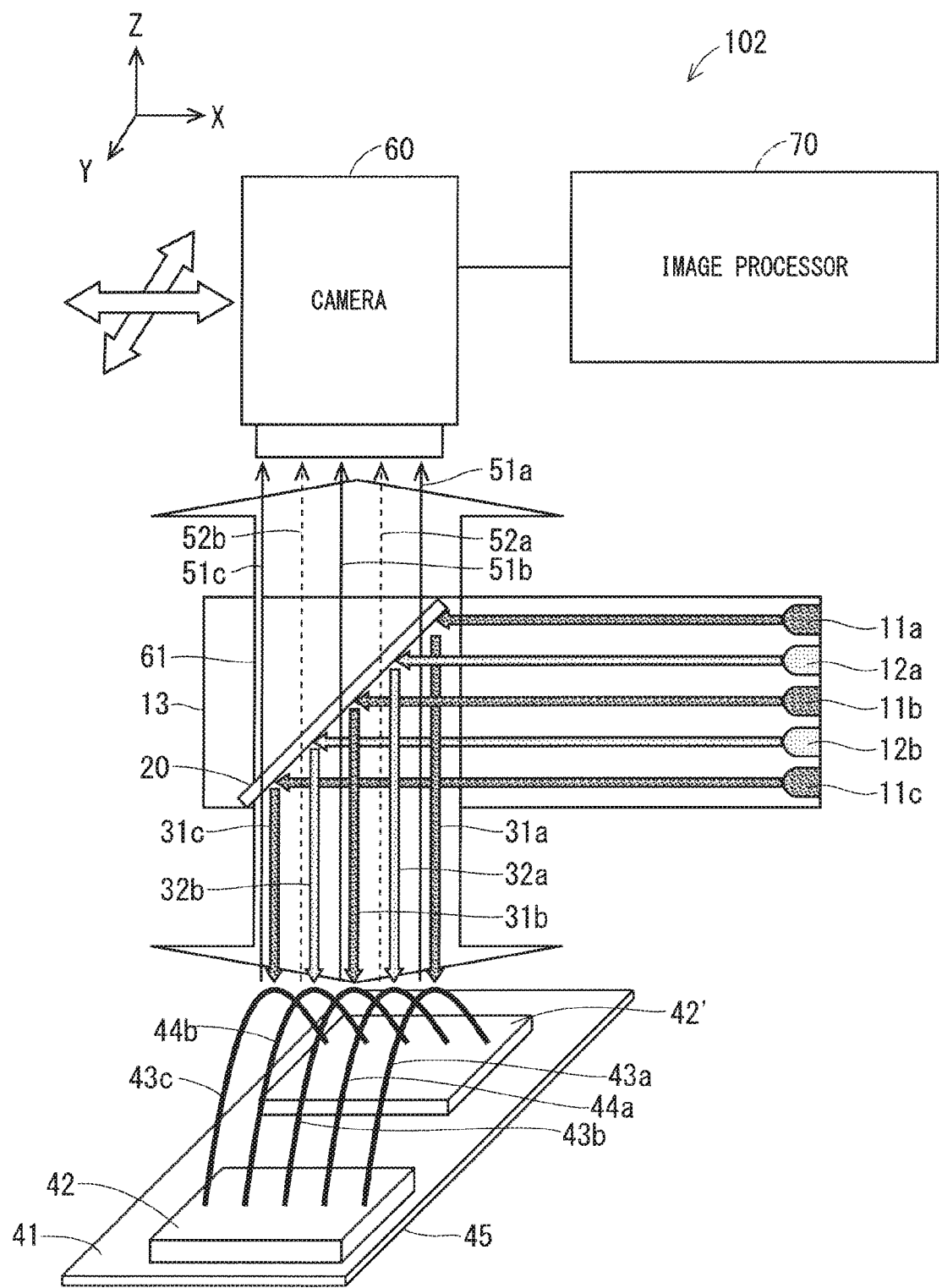
FIG. 3 illustrates a structure of a semiconductor manufacturing inspection system according to Embodiment 2.

FIG. 3 illustrates a structure of a semiconductor manufacturing inspection system 102 according to Embodiment 2. The semiconductor manufacturing inspection system 102 includes a single-color illumination unit 13, a measurement workpiece 45, the camera 60, and the image processor 70. In other words, the semiconductor manufacturing inspection system 102 includes the single-color illumination unit 13 and the measurement workpiece 45 instead of the single-color illumination unit 10 and the measurement workpiece 40, respectively, which are included in the structure of the semiconductor manufacturing inspection system 101 according to Embodiment 1. FIG. 4 illustrates an enlarged view of the single-color illumination unit 13 on the Y-Z plane.

Although the single-color illumination unit 10 according to Embodiment 1 includes the 3×3 LED chips, the single-color illumination unit 13 according to Embodiment 2 includes at least 4×4 LED chips. In the following description, the single-color illumination unit 13 includes 5×5 LED chips.

The measurement workpiece 45 differs from the measurement workpiece 40 according to Embodiment 1 in that the semiconductor elements 42 and 42' are connected through five wire loops 43a, 43b, 43c, 44a, and 44b. In other words, the measurement workpiece 45 includes the fourth wire loops 44b and the fifth wire loop 43c, in addition to the structure of the measurement workpiece 40 according to Embodiment 1. The wire loops 43c and 44b are made of the same material as that of the other wire loops 43a, 43b, and 44a.

The single-color illumination unit 13 includes LED chips 11a, 11b, 11c, 12a, and 12b, and the half mirror 20. As illustrated in FIG. 4, the five LED chips 11a are aligned along the Y-axis direction. The same applies to the LED chips 11b, 11c, 12a, and 12b. Furthermore, the LED chips 11a, 12a, 11b, 12b, and 11c are aligned in the negative Z-axis direction in this order. In other words, the single-color illumination unit 13 includes a 5×5 array of the LED chips on the Y-Z plane.

The luminances of the light beams emitted from the LED chips 12a and 12b are set lower than those of the LED chips 1a, 11b, and 11c. In other words, the LED chips with higher luminances and the LED chips with lower luminances are alternately disposed in the Z-axis direction also in the single-color illumination unit 13. The light beams emitted from the LED chips 12b and 11c are reflected by the half mirror 20 in a direction at right angles and enter the measurement workpiece 45 as incident light beams 32b and 31c, respectively. The incident light beams 32b and 31c are reflected by the wire loops 44b and 43c and serve as reflected light beams 52b and 51c, respectively. The optical axes of the light paths of the incident light beam 32b and the reflected light beam 52b coincide with each other. The optical axes of the light paths of the incident light beam 31c and the reflected light beam 51c coincide with each other.

The image processor 70 establishes a threshold range of luminances of reflected light beams for each of the wire loops to separately recognize the wire loops from the images. The threshold range of the luminances for the first wire loop 43a, the third wire loop 43b, and the fifth wire loop 43c is from T1 to T1', and the threshold range of the luminances for the second wire loop 44a and the fourth wire loop 44b is from T2 to T2'. Note that T2<T2'<T1<T1' is satisfied.

[B-2. Effects]

The effects of the semiconductor manufacturing inspection system 102 will be described with reference to FIGS. 3 and 4. The image processor 70 determines the height of each of the wire loops 43a, 43b, 43c, 44a, and 44b relative to the semiconductor element 42, from a plurality of images captured by the camera 60. The image processor 70 recognizes the wire loops based on the luminances of the reflected light beams from the measurement workpiece 45.

The incident light beams 31a, 31b, and 31c to be emitted to the wire loops 43a, 43b, and 43c, respectively, are higher in luminance than the incident light beams 32a and 32b to be emitted to the wire loops 44a and 44b, respectively. Thus, the specular reflections above the wire loops 43a, 43b, and 43c are stronger than those above the wire loops 44a and 44b. As a result, the luminance values L1a, L1b, and L1c of the reflected light beams 51a, 51b, and 51c, respectively, are larger than the luminance values L2a and L2b of the reflected light beam 52a and 52b, respectively.

The image processor 70 compares the luminance values of the reflected light beams 51a, 51b, 51c, 52a, and 52b with the thresholds established for the respective wire loops to recognize whether each of the reflected light beams is the reflected light beam of one of the first to fifth wire loops.

According to Embodiment 3, the incident light beams to be emitted to adjacent two of the five wire loops 43a, 43b, 43c, 44a, and 44b differ in luminance. The image processor 70 establishes values that do not overlap between the adjacent wire loops as a threshold range of luminances of reflected light beams according to the differences in luminance of these incident light beams to recognize one of the reflected light beams from the measurement workpiece 45 as the reflected light beam of a particular wire loop. Since the adjacent wire loops differ in luminance value of the reflected light beam, the image processor 70 prevents wrongly tracking another wire loop adjacent to the wire loop which is being tracked and to be measured. As a result, the image processor 70 can simultaneously measure the heights of at least four wire loops which are densely disposed.

Although FIG. 3 illustrates the measurement workpiece 45 including the five wire loops, Embodiment 2 is applicable to a measurement workpiece including many more wire loops as long as the wire loops are within the view of the camera 60. The more the number of wire loops included in a measurement workpiece increases, the more the inspection takt time is suppressed with application of the structure according to Embodiment 2, which improves the productivity.

[B-3. Advantages]

The semiconductor manufacturing inspection system 102 according to Embodiment 2 includes: the single-color illumination unit 13 including the plurality of LED chips 11a, 11b, 11c, 12a, and 12b to emit light beams to the plurality of wire loops 43a, 43b, 43c, 44a, and 44b connected to the surfaces of the semiconductor elements 42 and 42', the wire loops being made of a metal; the camera 60 to capture images of the wire loops 43a, 43b, 43c, 44a, and 44b above the wire loops 43a, 43b, 43c, 44a, and 44b, while moving in the X-Y plane direction parallel to the surfaces of the semiconductor elements 42 and 42'; and the image processor 70 to recognize an imaging region of each of the wire loops 43a, 43b, 43c, 44a, and 44b from the images captured by the camera 60, based on a luminance value of a corresponding one of the images and to measure a height of each of the wire loops 43a, 43b, 43c, 44a, and 44b based on the imaging region of the wire loop in the images. The LED chips 11a, 11b, 11c, 12a, and 12b emit the light beams to the separate wire loops 43a, 43b, 43c, 44a, and 44b, and the light beams emitted from two of the LED chips to adjacent two of the wire loops differ in luminance. Since the image processor 70 in the semiconductor manufacturing inspection system 102 with the aforementioned structure prevents wrongly tracking another wire loop adjacent to the wire loop which is being tracked and to be measured, it can accurately measure the heights of the wire loops 43a, 43b, 43c, 44a, and 44b densely disposed.

C. Embodiment 3

In Embodiment 3, the same reference numerals will be assigned to the same structure as those according to Embodiments 1 and 2 described above, and the description thereof will be omitted as necessary.

[C-1. Structure]

Figure 5:
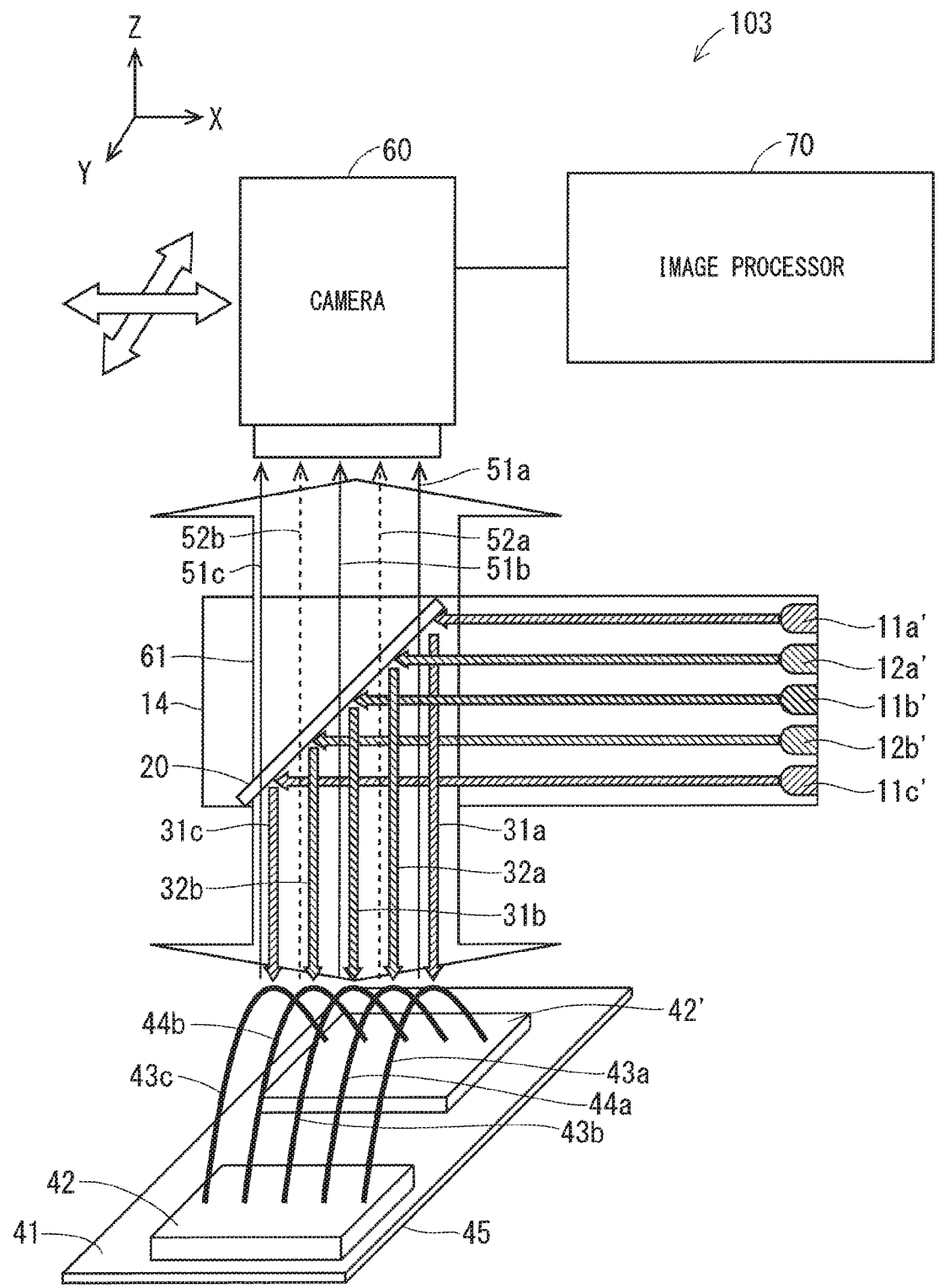
FIG. 5 illustrates a structure of a semiconductor manufacturing inspection system according to Embodiment 3.
Figure 6:
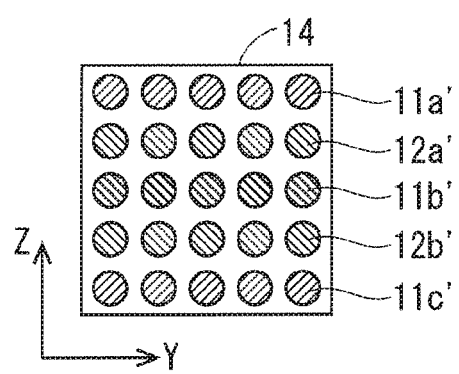
FIG. 6 illustrates an enlarged view of an illumination unit on the Y-Z plane according to Embodiment 3.

FIG. 5 illustrates a structure of a semiconductor manufacturing inspection system 103 according to Embodiment 3. The semiconductor manufacturing inspection system 103 includes an illumination unit 14, the measurement workpiece 45, the camera 60, and the image processor 70. In other words, the semiconductor manufacturing inspection system 103 includes the illumination unit 14 instead of the single-color illumination unit 13 included in the structure of the semiconductor manufacturing inspection system 102 according to Embodiment 2. FIG. 6 illustrates an enlarged view of the illumination unit 14 on the Y-Z plane.

The illumination unit 14 includes LED chips 11a', 11b', 11c', 12a', and 12b', and the half mirror 20. As illustrated in FIG. 6, the five LED chips 11a' are aligned along the Y-axis direction. The same applies to the LED chips 11b', 11c', 12a', and 12b'. Furthermore, the LED chips 11a', 12a', 11b', 12b', and 11c' are aligned in the negative Z-axis direction in this order. In other words, the illumination unit 14 includes a 5×5 array of the LED chips on the Y-Z plane.

Each of the LED chips 11a', 11b', 11c', 12a', and 12b' includes LEDs of three colors of RGB, and is configured to flexibly change the illuminant color. The other configurations of the LED chips 11a', 11b', 11c', 12a', and 12b', for example, the luminance of the emitted light beam, the wire loop to which the light beam is emitted, and the threshold range of the reflected light beam for recognizing the wire loops by the image processor 70 conform to those of the LED chips 11a, 11b, 11c, 12a, and 12b according to Embodiment 2.

[C-2. Effects]

Some power modules include at least two kinds of wire loops, such as an Au line functioning as an IC chip wire and an Al line functioning as a power chip wire, to take advantages of the cost. In a visible light region, Au has higher reflectivity in a high wavelength range, and Al has higher reflectivity in a full wavelength range. Thus, for example, emitting a blue light beam of a short wavelength to wire loops causes a problem of reduction in a luminance value of the reflected light beam from a wire loop made of Au, and a problem of failing to accurately recognize the wire loop.

In the semiconductor manufacturing inspection system 103, the color of the light beam emitted from each of the LED chips 11a', 11b', 11c', 12a', and 12b' can be selected according to reflective properties of a metal contained in the corresponding wire loop. Specifically, the color of the light beam emitted from each of the LED chips 11a', 11b', 11c', 12a', and 12b' is set to a color of a wavelength with high reflectivity which corresponds to the metal contained in a corresponding one of the wire loops 43a, 43b, 43c, 44a, and 44b to which the light beam is emitted. Consequently, the image processor 70 can accurately recognize the wire loops, irrespective of the metals contained in the wire loops. Thus, the semiconductor manufacturing inspection system 103 can accurately measure the heights of the wire loops densely disposed, irrespective of the metals contained in the wire loops.

Moreover, the image processor 70 may determine not only the luminance but also the hue of the reflected light beam when recognizing each of the wire loops. When light beams of different colors are emitted to adjacent two wire loops, one of the wire loops can be tracked based on the hue of the reflected light beam. Thus, the precision of tracking the wire loop by the image processor 70 is improved.

[C-3. Effects]

In the semiconductor manufacturing inspection system 103 according to Embodiment 3, each of the LED chips 11a', 11b', 11c', 12a', and 12b' emits a light beam of a color corresponding to the reflective properties of a metal contained in one of the wire loops 43a, 43b, 43c, 44a, and 44b to which the LED chip emits the light beam. Consequently, the image processor 70 can accurately recognize the wire loops, irrespective of the metals contained in the wire loops. Thus, the semiconductor manufacturing inspection system 103 can accurately measure the heights of the wire loops densely disposed, irrespective of the metals contained in the wire loops.

D. Embodiment 4

In Embodiment 4, the same reference numerals will be assigned to the same structure as those according to Embodiments 1 to 3 described above, and the description thereof will be omitted as necessary.

[D-1. Structure]

Figure 7:
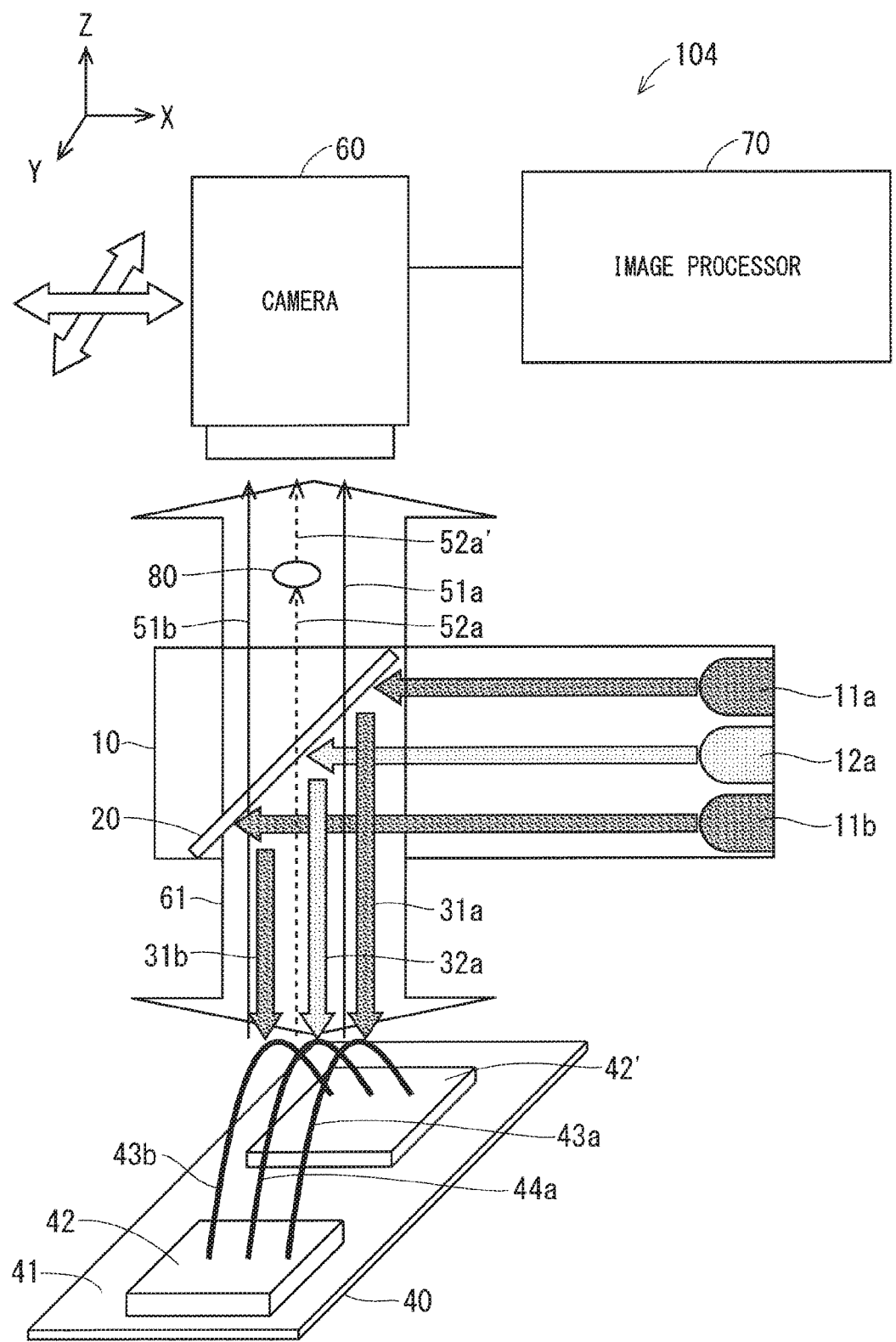
FIG. 7 illustrates a structure of a semiconductor manufacturing inspection system according to Embodiment 4.

FIG. 7 illustrates a structure of a semiconductor manufacturing inspection system 104 according to Embodiment 4. The semiconductor manufacturing inspection system 104 includes an ND filter 80, in addition to the structure of the semiconductor manufacturing inspection system 101 according to Embodiment 1. The ND filter 80 is disposed in a light path of the reflected light beam 52a to dim the reflected light beam 52a. Hereinafter the reflected light beam 52a passing through the ND filter 80 will be denoted by a reflected light beam 52a'. Although the ND filter 80 is disposed between the single-color illumination unit 10 and the camera 60 in FIG. 7, the ND filter 80 should be disposed at least in the light path of the reflected light beam 52a and may be disposed between the measurement workpiece 40 and the single-color illumination unit 10.

[D-2. Effects]

The effects of the semiconductor manufacturing inspection system 104 will be described with reference to FIG. 7. The reflected light beam 52a' passing through the ND filter 80 is lower in luminance value than the reflected light beam 52a before passing through the ND filter 80. Thus, the ND filter 80 can more finely control the luminance value of the reflected light beam 52a' obtained by the camera 60, while the single-color illumination unit 10 adjusts the luminance of the light beam emitted by the LED chips 12a. This increases the inspection flexibility in the X-Y plane direction that is a longitudinal direction of the wires on the measurement workpiece 40.

Furthermore, when the reflected light beam 51a or 51b interferes with the reflected light beam 52a, the luminance value L2a is sometimes unexpectedly increased to the threshold range T1-T1'. However, such a phenomenon can be suppressed by dimming the reflected light beam 52a using the ND filter 80.

In the example of FIG. 7, the ND filter 80 is inserted into the light path of the reflected light beam 52a of the second wire loop 44a. However, the ND filter 80 may be inserted into the light path of the reflected light beam 51a of the first wire loop 43a or the reflected light beam 51b of the third wire loop 43b. Moreover, the ND filter 80 may be inserted into each of the light paths of the reflected light beams of all the wire loops. This can suppress the intense reflection from a metal electrode formed on the surface of a semiconductor element, and also the reflected light beam of a wire loop other than a wire loop to be measured.

[D-3. Effects]

The semiconductor manufacturing inspection system 104 according to Embodiment 4 includes, for at least one wire loop, the ND filter 80 disposed in a pre-stage of the camera 60 and in a light path of a reflected light beam of a light beam emitted by a LED chip. Consequently, the luminance value of the reflected light beam from the wire loop that is obtained by the camera 60 can be more finely controlled, which increases the inspection flexibility in the longitudinal direction of the wires on the measurement workpiece 40.

Embodiments can be freely combined, and appropriately modified or omitted within the scope of the present invention.

What is claimed is:

1. A semiconductor manufacturing inspection system, comprising:
    an illumination unit including a plurality of LED chips to emit light beams to a plurality of wire loops connected to surfaces of semiconductor elements, the wire loops being made of at least one metal;
    a camera to capture images of the wire loops above the wire loops, while moving in a direction parallel to the surfaces of the semiconductor elements; and
    an image processor to recognize an imaging region of each of the wire loops from the images captured by the camera, based on a luminance value of a corresponding one of the images and to measure a height of each of the wire loops based on the imaging region of the wire loop in the images,
    wherein the LED chips emit the light beams to the separate wire loops, and
    the light beams emitted from two of the LED chips to adjacent two of the wire loops differ in luminance.

2. The semiconductor manufacturing inspection system according to claim 1,
    wherein the wire loops are aligned in one direction,
    the LED chips are aligned in an order identical to an order of the wire loops to which the LED chips emit the light beams, and
    among the LED chips, an LED chip that emits a light beam of a first luminance and an LED chip that emits a light beam of a second luminance lower than the first luminance are alternately disposed.

3. The semiconductor manufacturing inspection system according to claim 1,
    wherein the image processor establishes a threshold range of luminance values of each of the images to recognize the imaging region of the wire loop, and the threshold ranges do not overlap between the adjacent two wire loops.

4. The semiconductor manufacturing inspection system according to claim 1,
    wherein each of the LED chips emits a light beam of a color corresponding to reflective properties of the at least one metal contained in one of the wire loops to which the LED chip emits the light beam.

5. The semiconductor manufacturing inspection system according to claim 1, further comprising
    an ND filter disposed in a pre-stage of the camera for at least one of the wire loops, the ND filter being disposed in a light path of a reflected light beam of the light beam emitted by a corresponding one of the LED chips.

\* \* \* \* \*